US010345693B2

(12) United States Patent
He

(10) Patent No.: US 10,345,693 B2
(45) Date of Patent: Jul. 9, 2019

(54) MANUFACTURING METHOD OF A MASK PLATE AND A COLOR FILTER SUBSTRATE

(71) Applicant: Shenzhen China Star Optoelectronics Technology Co., Ltd., Shenzhen, Guangdong (CN)

(72) Inventor: Hui He, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 221 days.

(21) Appl. No.: 15/109,029

(22) PCT Filed: May 24, 2016

(86) PCT No.: PCT/CN2016/083093
§ 371 (c)(1),
(2) Date: Jun. 29, 2016

(87) PCT Pub. No.: WO2017/185438
PCT Pub. Date: Nov. 2, 2017

(65) Prior Publication Data

US 2018/0101092 A1 Apr. 12, 2018

(30) Foreign Application Priority Data

Apr. 26, 2016 (CN) .......................... 2016 1 0265438

(51) Int. Cl.
*G03F 7/20* (2006.01)
*G03F 1/32* (2012.01)
(Continued)

(52) U.S. Cl.
CPC ................ *G03F 1/32* (2013.01); *G02B 5/20* (2013.01); *G02B 5/201* (2013.01); *G02B 5/223* (2013.01);
(Continued)

(58) Field of Classification Search
CPC . G03F 7/0007; G03F 1/38; G03F 1/50; G03F 1/54; G03F 1/60; G02B 5/201; G02B 5/223
(Continued)

(56) References Cited

U.S. PATENT DOCUMENTS

2002/0119379 A1 8/2002 Noguchi et al.
2008/0266691 A1* 10/2008 Kaihoko ................ G02B 5/205 359/885
(Continued)

FOREIGN PATENT DOCUMENTS

CN 103383522 A 11/2013
JP 1997325469 A 12/1997
(Continued)

*Primary Examiner* — John A McPherson
(74) *Attorney, Agent, or Firm* — Andrew C. Cheng

(57) ABSTRACT

The present disclosure discloses a mask plate, the mask plate includes: a substrate; a plurality of shading portions respectively arranged in intervals on a surface of the substrate; a plurality of semi-transparent portions respectively arranged against both sides of the shading portions, wherein, a transparent region between two adjacent shading portions are formed between two-adjacent-semi-transparent-portions. The present disclosure discloses a manufacturing method of a color filter substrate.

3 Claims, 2 Drawing Sheets

70
10
50
30
22
20

(51) Int. Cl.

| | |
|---|---|
| ***G02B 5/22*** | (2006.01) |
| ***G02B 5/20*** | (2006.01) |
| ***G03F 7/00*** | (2006.01) |
| ***G03F 7/16*** | (2006.01) |
| ***G03F 7/30*** | (2006.01) |

(52) U.S. Cl.
CPC .............. *G03F 7/0007* (2013.01); *G03F 7/16* (2013.01); *G03F 7/2002* (2013.01); *G03F 7/30* (2013.01)

(58) Field of Classification Search
USPC ...................................... 430/7; 349/106, 110
See application file for complete search history.

(56) References Cited

U.S. PATENT DOCUMENTS

| | | | | |
|---|---|---|---|---|
| 2013/0222936 | A1* | 8/2013 | Kawanishi ............. | G02B 5/223 359/891 |
| 2014/0045102 | A1* | 2/2014 | Jang ...................... | G03F 7/0035 430/5 |
| 2014/0092497 | A1 | 4/2014 | Yuan | |

FOREIGN PATENT DOCUMENTS

| | | | |
|---|---|---|---|
| JP | 2001174976 | A | 6/2001 |
| JP | 2013134435 | A | 7/2013 |

* cited by examiner

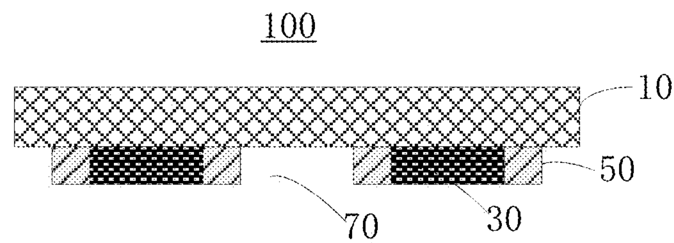
Fig.1
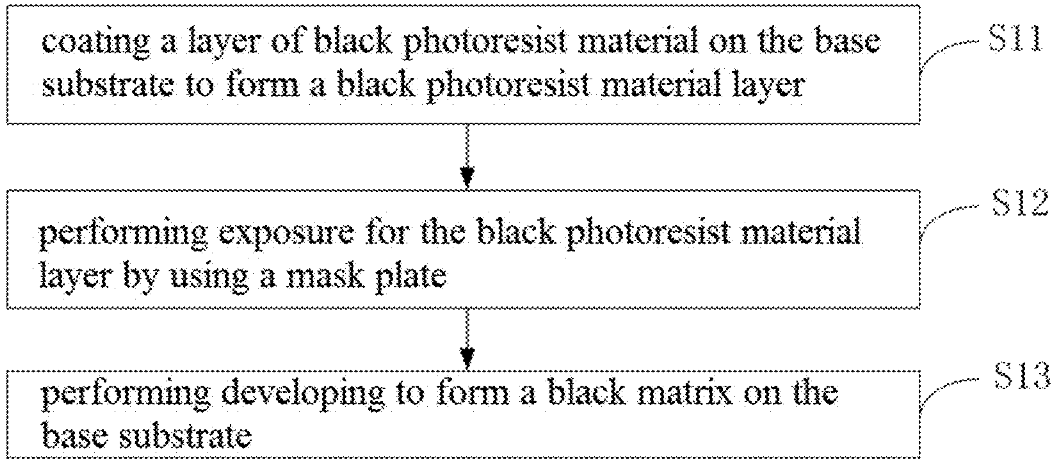
Fig.2
22
20
Fig.3

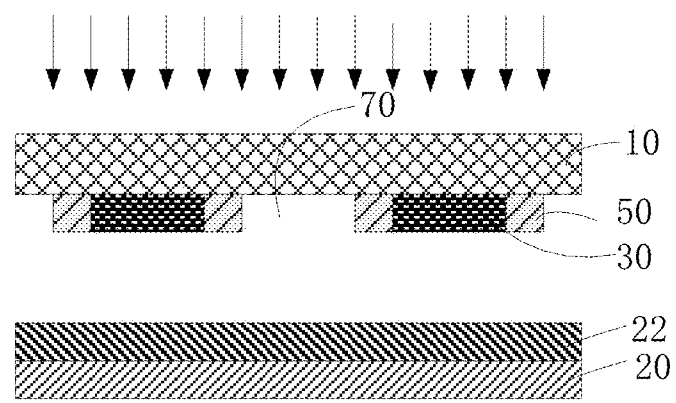
Fig.4
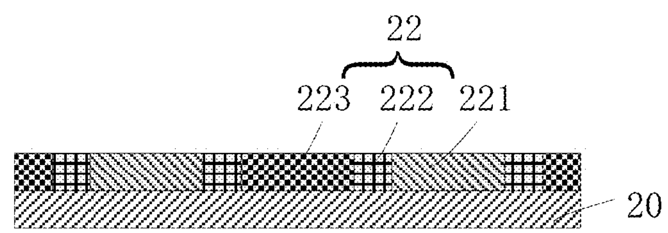
Fig.5
200
21 (223)
20
Fig.6

MANUFACTURING METHOD OF A MASK PLATE AND A COLOR FILTER SUBSTRATE

FIELD OF INVENTION

The disclosure is related to display technical field, in particular to a manufacturing method of a mask plate and a color filter substrate.

BACKGROUND

With developing display panel technology, a display panel with narrow border and high resolution is more and more popular among customers. In order to meet the demand of customers, higher accuracy of a black matrix affecting resolution and size of display panel is also needed. Nowadays, the procedure of manufacturing a black matrix is usually performed by using scanning exposure method and proximity exposure method. Wherein, the accuracy of scanning exposure method is higher, and the manufacturing cost is higher because the expense is more expensive; as a result, most enterprise choses proximity exposure method. However, the structure of a mask plate by using proximity exposure method, transparent region—shading region, makes exposed photoresist directly contacts with non-exposed photoresist, and then affects dimensional accuracy of the photoresist because it is difficult to control time during developing procedure; therefore, dimensional accuracy of the black matrix pattern made by using proximity exposure method will be lower.

SUMMARY OF THE INVENTION

To solve the main technical problem, the present disclosure is to provide a mask plate that could improve accuracy of a black matrix and resolution of a display panel during manufacturing the black matrix.

Furthermore, to provide a color filter substrate and a manufacturing method thereof is in need.

To solve the aforementioned technical problem, a technical plan provided in the present disclosure is a mask plate, comprising:

a substrate;

a plurality of shading portions respectively arranged in intervals on a surface of the substrate;

a plurality of semi-transparent portions respectively arranged against both sides of the shading portions, wherein, a transparent region between two adjacent shading portions are formed between two-adjacent-semi-transparent-portions.

Wherein, a material of the substrate is quartz, a material of the shading portions is chromium, and a material of the semi-transparent portions is material that is used in a gray-tone mask plate or in half-tone mask plate.

To solve the aforementioned technical problem, another technical plan provided in the present disclosure is a mask plate, comprising:

a substrate;

a plurality of shading portions respectively arranged in intervals on a surface of the substrate;

a plurality of semi-transparent portions respectively arranged against both sides of the shading portions, wherein, a transparent region between two adjacent shading portions are formed between two-adjacent-semi-transparent-portions.

Wherein, a width of the transparent region is larger than a width of the semi-transparent portion.

Wherein, a material of the substrate is quartz, and a material of the shading portions is chromium.

Wherein, a material of the semi-transparent portions is material that is used in a gray-tone mask plate or in half-tone mask plate.

To solve the aforementioned technical problem, another technical plan provided in the present disclosure is a manufacturing method of a color filter substrate, comprising forming a black matrix on a base substrate, wherein, the step of forming the black matrix on the base substrate comprising:

coating a layer of black photoresist material on the base substrate to form a black photoresist material layer;

performing exposure for the black photoresist material layer by using a mask plate;

performing developing to form a black matrix on the base substrate;

wherein, the mask plate comprising:

a substrate;

a plurality of shading portions respectively arranged in intervals on a surface of the substrate;

a plurality of semi-transparent portions respectively arranged against both sides of the shading portions, a transparent region between two adjacent shading portions are formed between two-adjacent-semi-transparent-portions.

Wherein, the black photoresist material layer is divided to a first exposure region, a second exposure region, and a third exposure region after being exposure; the first exposure region is corresponding to the shading portions of the mask plate, the second exposure region is corresponding to the semi-transparent portions of the mask plate, and the third exposure region is corresponding to the transparent regions of the mask plate, wherein luminous exposure of the third exposure region, luminous exposure of the second exposure region and luminous exposure of the first exposure region are decreasing in sequent.

Wherein, a solubility of the third exposure region, a solubility of the second exposure region and a solubility of the first exposure region are decreasing in sequent at the same condition during developing.

Wherein, the black matrix is formed on the base substrate during performing developing:

the post-exposure base substrate is put into developing solvent to remove the first exposure region and the second exposure region and to keep the third exposure region for the black matrix forming.

Wherein, a width of the black matrix is equal to a width of the transparent region on the mask plate.

Wherein, a material of the semi-transparent portions is material that is used in a gray-tone mask plate or in half-tone mask plate.

The advantages of the present disclosure are: to distinguish the differences from the prior art, two semi-transparent portions are arranged between the shading portions and the transparent region, and while performing exposure with the mask plate, luminous exposure of a black photoresist material layer corresponding to the semi-transparent portions is smaller than luminous exposure of the black photoresist material layer corresponding to the transparent region; therefore, a solubility of the black photoresist material layer corresponding to the semi-transparent portions is between a solubility of the black photoresist material layer corresponding to transparent region and a solubility of the black photoresist material layer corresponding to shading portions during developing for being a role as a buffer by controlling the time of developing easily to improve dimensional accuracy of developing. Besides, the black photoresist material layer corresponding to the semi-transparent portions can play a role of buffer to set up that a width of the transparent region is smaller than a width of the transparent region of the mask plate in prior art. Furthermore, a width of a black matrix made after developing is smaller and numbers of sub-pixels on unit area of the color filter is increasing; thus, the resolution of a display panel is also increasing.

BRIEF DESCRIPTION OF THE DRAWINGS

FIG. 1 is a section structural schematic diagram illustrating a mask plate according to the present disclosure.

FIG. 2 is a flow chart illustrating a manufacturing method of a color filter substrate according to the present disclosure.

FIG. 3 is a schematic diagram illustrating a black photoresist material layer formed in a manufacturing method of a color filter substrate according to the present disclosure.

FIG. 4 is a schematic diagram illustrating performing exposure to the black photoresist material layer in the manufacturing method of the color filter substrate according to the present disclosure.

FIG. 5 is a schematic diagram illustrating the black photoresist material layer after being exposure in a manufacturing method of the color filter substrate for according to the present disclosure.

FIG. 6 is a schematic diagram illustrating a manufacturing method of the color filter substrate after performing developing according to the present disclosure.

DETAILED DESCRIPTION

Detailed descriptions will be given along with the embodiment illustrated in the attached drawings.

Please refer to FIG. 1, a mask plate 100 of the present disclosure comprises a substrate 10, a plurality of shading portions 30 and a plurality of semi-transparent portions 50; the plurality of shading portions 30 respectively arranged in intervals on a surface of the substrate 10, the plurality of semi-transparent portions 50 respectively arranged against both sides of the shading portions, and a transparent region 70 between two adjacent shading portions 30 are formed between two-adjacent-semi-transparent-portions 50.

A material of the substrate 10 is quartz but not limited to, and a material of the shading portions 30 is chromium but not limited hereto.

A material of the semi-transparent portions 50 is material that is used in a gray-tone mask plate or in half-tone mask plate in order that a part of light could pass through the semi-transparent portions 50, and the other part of light is reflected during exposure.

Compare to a traditional mask plate, the semi-transparent portions 50 is arranged between the shading portions 30 and the transparent region 70 in the mask plate 100 of the present disclosure. while performing exposure by using the mask plate 100 of the present disclosure, luminous exposure of a black photoresist material layer corresponding to the semi-transparent portions 50 is smaller than luminous exposure of the black photoresist material layer corresponding to the transparent region 70 in order that a solubility of the black photoresist material layer corresponding to the semi-transparent portions 50 is between a solubility of the black photoresist material layer corresponding to transparent region 70 and a solubility of the black photoresist material layer corresponding to shading portions 30 during developing for being a role as a buffer by controlling the time of developing easily to improve dimensional accuracy of developing by controlling the time of developing easily. Besides, the black photoresist material layer corresponding to the semi-transparent portions 50 can play a role of buffer to set up a width of the transparent region 70 smaller than a width of the transparent region in prior art. Furthermore, a width of a black matrix made after developing is smaller and numbers of sub-pixels on unit area of the color filter is increasing; thus, the resolution of a display panel is also increasing.

Please refer to FIG. 2 and FIGS. 3 to 6, the present disclosure provides a manufacturing method of a color filter substrate 200 comprising steps of forming a black matrix 21 on a base substrate 20, wherein, the steps comprises:

In step 11, please refer to FIG. 3, a black photoresist material layer 22 is formed by coating a layer of black photoresist material on the base substrate 20.

It could be understood that the solubility of the black photoresist material layer 22 corresponding to the semi-transparent portions and the solubility of the black photoresist material layer 22 corresponding to the transparent region are different under the same luminous exposure during developing, and the black photoresist material layer 22 corresponding to the transparent region is harder to dissolve at the same condition.

In step S12, refer to FIG. 4, the black photoresist material layer 22 is performed exposure to by using the mask plate 100.

Wherein, the mask plate 100 comprises a substrate 10, a plurality of shading portions 30 and a plurality of semi-transparent portions 50; the plurality of shading portions 30 respectively arranged in intervals on a surface of the substrate 10, the plurality of semi-transparent portions 50 respectively arranged against both sides of the shading portions, and a transparent region 70 between two adjacent shading portions 30 are formed between two-adjacent-semi-transparent-portions 50.

A width of the transparent region 70 is larger than a width of the semi-transparent 50 portion.

A material of the substrate 10 is quartz, and a material of the shading portions 30 is chromium.

A material of the semi-transparent portions 50 is material that is used in a gray-tone mask plate or in half-tone mask plate.

It could be understood that the function of exposure is projecting the pattern made of the shading portions 30, the semi-transparent portions 50 and the transparent region 70 on the mask plate 100 into the black photoresist material layer 22 by the UV irradiation.

It could be understood that, refer to FIG. 5, the black photoresist material layer 22 is divided to a first exposure region 221, a second exposure region 222, and a third exposure region 223 after being exposure, wherein the first exposure region 221 is corresponding to the shading portions 30 of the mask plate 100 without UV irradiation, the second exposure region 222 is corresponding to the semi-transparent portions 50 of the mask plate 100 with part of UV irradiation, and the third exposure region 223 is corresponding to the transparent region 70 of the mask plate 100 with sufficient UV irradiation. Wherein, luminous exposure of the third exposure region 223, luminous exposure of the second exposure region 222 and luminous exposure of the first exposure region 221 are decreasing in sequent.

In step S13, please refer to FIG. 6 together, the black matrix 21 is formed on the base substrate 20 during performing developing.

It could be understood that a solubility of the first exposure region 221, a solubility of the second exposure region 222 and a solubility of the third exposure region 223 are decreasing in sequent at the same condition during developing. Hence, the second exposure region 222 can be a role as a buffer so that the time of developing can be controlled easily and then dimensional accuracy of the third exposure region 223 can be improved, i.e., dimensional accuracy of the black matrix 21.

Wherein, in performing developing, the specific step of forming the black matrix 21 on the base substrate 20 comprising:

the post-exposure base substrate 20 is put into developing solvent to remove the first exposure region 221 and the second exposure region 222 and then to keep the third exposure region 223 for the black matrix 21 forming.

It could be understood that a width of the black matrix 21 is equal to a width of the transparent regions 70 on the mask plate 100 by controlling the time of developing.

It could be understood that the present disclosure further comprises a flow of forming a color resin pattern with at least two colors on the base substrate 20 in other embodiments.

To distinguish over the prior art, the present disclosure provides a manufacturing method of a color filter in which semi-transparent portion 50 is arranged between a shading portion 30 and a transparent region 70 on a mask plate 100, therefore, a solubility of the second exposure region 222 is between a solubility of the first exposure region 221 and a solubility of the third exposure region 223. Hence, the second exposure region 222 can be a role as a buffer so that staffs can control the time of developing easily, and dimensional accuracy of the third exposure region 223 can be improved, i.e., dimensional accuracy of the black matrix 21. Besides, the second exposure region 222 can be a role as a buffer during developing to set up that a width of the transparent region 70 is smaller than a width of the transparent region of the mask plate in prior art. Furthermore, a width of a black matrix 21 made after developing is smaller and numbers of sub-pixels per unit area of the color filter is increasing; thus, the resolution of a display panel is also increasing.

Even though information and the advantages of the present embodiments have been set forth in the foregoing description, together with details of the mechanisms and functions of the present embodiments, the disclosure is illustrative only; and that changes may be made in detail, especially in matters of shape, size and arrangement of parts within the principles of the present embodiments to the full extend indicated by the broad general meaning of the terms in which the appended claims are expressed.

The invention claimed is:

1. A manufacturing method of a color filter substrate, comprising forming a black matrix on a base substrate, wherein, the step of forming the black matrix on the base substrate comprising:

coating a layer of black photoresist material on the base substrate to form a black photoresist material layer;

performing exposure for the black photoresist material layer by using a mask plate;

performing developing to form a black matrix on the base substrate;

wherein, the mask plate comprising:

a substrate;

a plurality of shading portions respectively arranged in intervals on a surface of the substrate;

a plurality of semi-transparent portions respectively arranged against both sides of the shading portions, wherein, a transparent region is formed between every two-adjacent-semi-transparent-portions located between two adjacent shading portions, the black photoresist material layer is divided to a first exposure region, a second exposure region, and a third exposure region after being exposure; the first exposure region is corresponding to the shading portions of the mask plate, the second exposure region is corresponding to the semi-transparent portions of the mask plate, and the third exposure region is corresponding to the transparent regions of the mask plate, wherein luminous exposure of the third exposure region, luminous exposure of the second exposure region and luminous exposure of the first exposure region are decreasing in sequent, wherein a solubility of the first exposure region, a solubility of the second exposure region and a solubility of the third exposure region are decreasing in sequent at the same condition during developing, wherein forming the black matrix on the base substrate during performing developing specifically comprising: putting the post-exposure base substrate into developing solvent to fully remove the first exposure region and the second exposure region and to keep the third exposure region for the black matrix forming such that a width of the third exposure region is equal to a width of the transparent region.

2. The method according to claim 1, wherein, a width of the black matrix is equal to a width of the transparent regions on the mask plate.

3. The method according to claim 1, wherein, a material of the semi-transparent portions is material that is used in a gray-tone mask plate or in half-tone mask plate.

* * * * *